United States Patent
Leung et al.

(10) Patent No.: US 7,502,271 B2
(45) Date of Patent: Mar. 10, 2009

(54) SEMICONDUCTIR DEVICE AND PROGRAMMING METHOD

(75) Inventors: Chi Yat Leung, Kowloon (HK); Wai Chung Chan, Kowloon (HK)

(73) Assignee: Spansion LLC, Sunnyvale, CA (US)

( * ) Notice: Subject to any disclaimer, the term of this patent is extended or adjusted under 35 U.S.C. 154(b) by 149 days.

(21) Appl. No.: 11/789,888

(22) Filed: Apr. 25, 2007

(65) Prior Publication Data
US 2007/0253266 A1    Nov. 1, 2007

Related U.S. Application Data

(63) Continuation-in-part of application No. PCT/JP2006/308950, filed on Apr. 28, 2006.

(51) Int. Cl.
*G11C 7/02* (2006.01)
(52) U.S. Cl. ...................... 365/207; 365/203
(58) Field of Classification Search ............... 365/207, 365/203
See application file for complete search history.

(56) References Cited

U.S. PATENT DOCUMENTS

| | | | |
|---|---|---|---|
| 7,068,534 B2* | 6/2006 | Bedeschi et al. | 365/163 |
| 2002/0015345 A1* | 2/2002 | Fournel | 365/207 |
| 2002/0070804 A1* | 6/2002 | Giduturi | 330/253 |
| 2007/0030740 A1* | 2/2007 | Wada et al. | 365/189.09 |

FOREIGN PATENT DOCUMENTS

| | | |
|---|---|---|
| JP | 06215585 | 8/1994 |
| JP | 11149790 | 6/1999 |
| JP | 2005510006 | 4/2005 |

* cited by examiner

*Primary Examiner*—Hoai V Ho
*Assistant Examiner*—A. T. T.

(57) ABSTRACT

The present invention provides a semiconductor device and a control method thereof, the semiconductor device including: a bit line connected to a memory cell; a voltage control circuit controlling a voltage supplied from a voltage source to the bit line; a differential amplifier circuit providing the control voltage to the voltage control circuit in response to a voltage at a node coupled to the bit line and a reference voltage; and a current source providing a current to the differential amplifier circuit. The current source provides more current to the differential amplifier circuit in the first period including a period for precharging than in the second period after precharging.

21 Claims, 10 Drawing Sheets

SEMICONDUCTIR DEVICE AND PROGRAMMING METHOD

CLAIM OF PRIORITY

This is a continuation-in-part of International Application No. PCT/JP2006/308950, filed Apr. 28, 2006 which was not published in English under PCT Article 21(2).

TECHNICAL FIELD

This invention relates generally to semiconductors and control methods thereof, and more particularly, to a semiconductor device having a cascode circuit and a control method, thereof.

BACKGROUND OF THE INVENTION

In recent years, non-volatile memories of semiconductor devices, in which data is rewritable, are widely used. For example, in flash memories that are typical non-volatile memories, a transistor making up a memory cell has a floating gate or insulation film, also known as a charge storage layer. Data is stored by accumulating charge in the charge storage layer. When the charge is stored in the charge storage layer, a threshold voltage of the transistor is changed. Data is read by reading the threshold voltage of the transistor as a drain current value.

The drain current value is read as follows. Firstly, in a cascode circuit, a bit line connected to a memory cell is precharged. After the bit line is precharged, a cascode circuit converts the drain current into voltage. A sense amplifier compares the converted voltage with a reference voltage to determine whether the data is "0" or "1". Here, to precharge the bit line means that the bit line is boosted up to a given voltage before the cascode circuit reads the drain current.

FIG. 1 is a circuit diagram of a cascode circuit 100 of a conventional example. A bit line BL is connected to the drain of the transistor making up a memory cell 12 (hereinafter, simply referred to as memory cell). The bit line BL is connected through a pass gate composed of a resistor 101 and a capacitor 102 to a node DATAB. The node DATAB is connected to a differential amplifier circuit 105. The differential amplifier circuit 105 compares a voltage of DATAB with a reference voltage CASREF, and outputs the voltage Vo in proportion to the difference between DATAB and CASREF. Vo is input into the gate of a P-type FET 104 arranged between the node DATAB and the voltage source Vcc.

While the bit line BL is being precharged, if the voltage of DATAB corresponding to the voltage of the bit line BL is lower than the reference voltage CASREF, the voltage Vo becomes lower and the FET 104 supplies current. Accordingly, the bit line BL is charged. If the bit line BL comes to reach the voltage to read the data in the memory cell 12, precharge is completed. At the time of reading the data in the memory cell 12 (that is, reading the current flowing across the memory cell 12), the differential amplifier circuit 105 controls the FET 104 so that the voltage of the bit line BL may be constant. The more the current flows across the memory cell 12, the more the current flows across the FET 104 and the voltage Vo decreases. The less the current flows across the memory cell 12, the less the current flows across the FET 104 and the voltage Vo increases. In this manner, the current flowing across the memory cell 12 is converted into the voltage Vo and the voltage Vo is output to the sense amplifier circuit.

Japanese Patent Application Publication No. 11-149790 discloses a sense amplifier circuit that allows high-speed data reading, by switching on a transistor for precharge at the time of precharging.

In the cascode circuit 100 having the differential amplifier circuit 105 of the conventional example, the differential amplifier circuit 105 is used for precharging and reading data. In order to shorten the data reading time, it is effective to shorten the time necessary for precharging. If the current of the differential amplifier circuit 105 is increased, the time for precharging can be shortened. However, the current for reading the data is increased, thereby increasing the consumption current.

SUMMARY OF THE INVENTION

The present invention has been made in view of the above circumstances and provides a semiconductor device and a control method thereof, by which a precharge time can be shortened and the consumption power can be reduced at the time of reading data.

According to an embodiment of the present invention, there is provided a semiconductor device including: a bit line connected to a memory cell; a voltage control circuit coupled to the bit line and controlling a voltage supplied from a voltage source to the bit line in response to a control voltage; a differential amplifier circuit coupled to the voltage control circuit and providing the control voltage thereto in response to a voltage associated with the bit line and a reference voltage; and a current source providing a current to the differential amplifier circuit, and the current source provides a first current to the differential amplifier circuit during a first period including a period for precharging the bit line, and provides a second current to the differential amplifier circuit during a second period including a period for reading data from the memory cell after precharging the bit line, the first current being larger than the second current. It is possible to shorten the time required for precharging by providing a large amount of current to the differential amplifier circuit during precharging. Meanwhile, after precharging, it is possible to cut down the consumption current by supplying a small amount of current to the differential amplifier circuit.

According to another embodiment of the present invention, there is provided a method for controlling a semiconductor device including a bit line connected to a memory cell, a voltage control circuit controlling a voltage supplied from a voltage source to the bit line in response to a control voltage, and a differential amplifier circuit providing the control voltage to the voltage control circuit in response to a voltage associated with the bit line and a reference voltage, and a memory cell array having nonvolatile memory cells, the method including: providing a first current to the differential amplifier circuit during a first period including a period for precharging the bit line; and providing a second current smaller than the first current, to the differential amplifier circuit during a second period including a period for reading data from the memory cell after precharging the bit line. It is possible to shorten the time required for precharging by providing a large amount of current to the differential amplifier circuit during precharging. Meanwhile, after precharging, it is possible to cut down the consumption current by supplying a small amount of current to the differential amplifier circuit.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
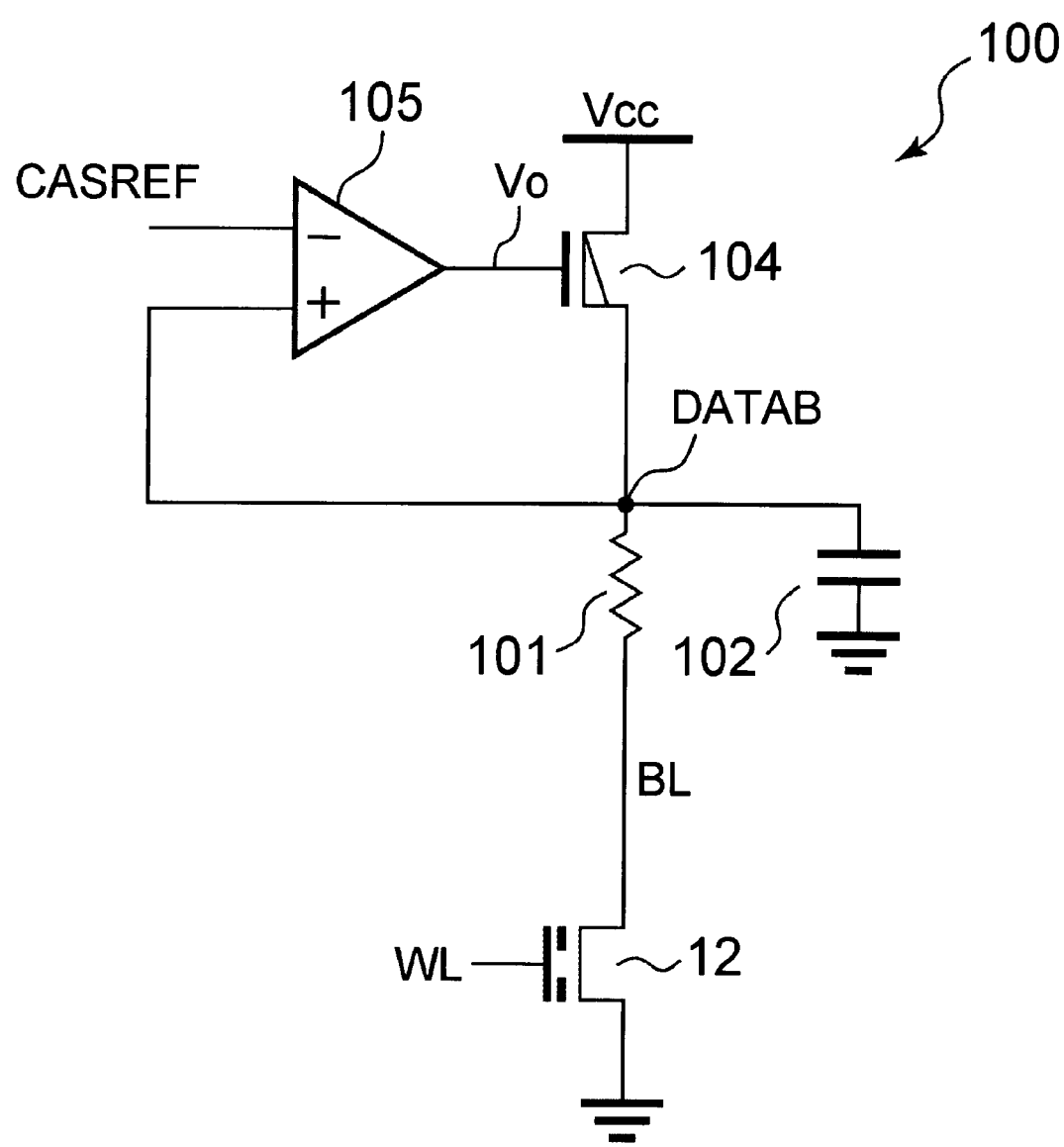
FIG. 1 is a circuit diagram of a cascode circuit of a conventional example.
Figure 2:
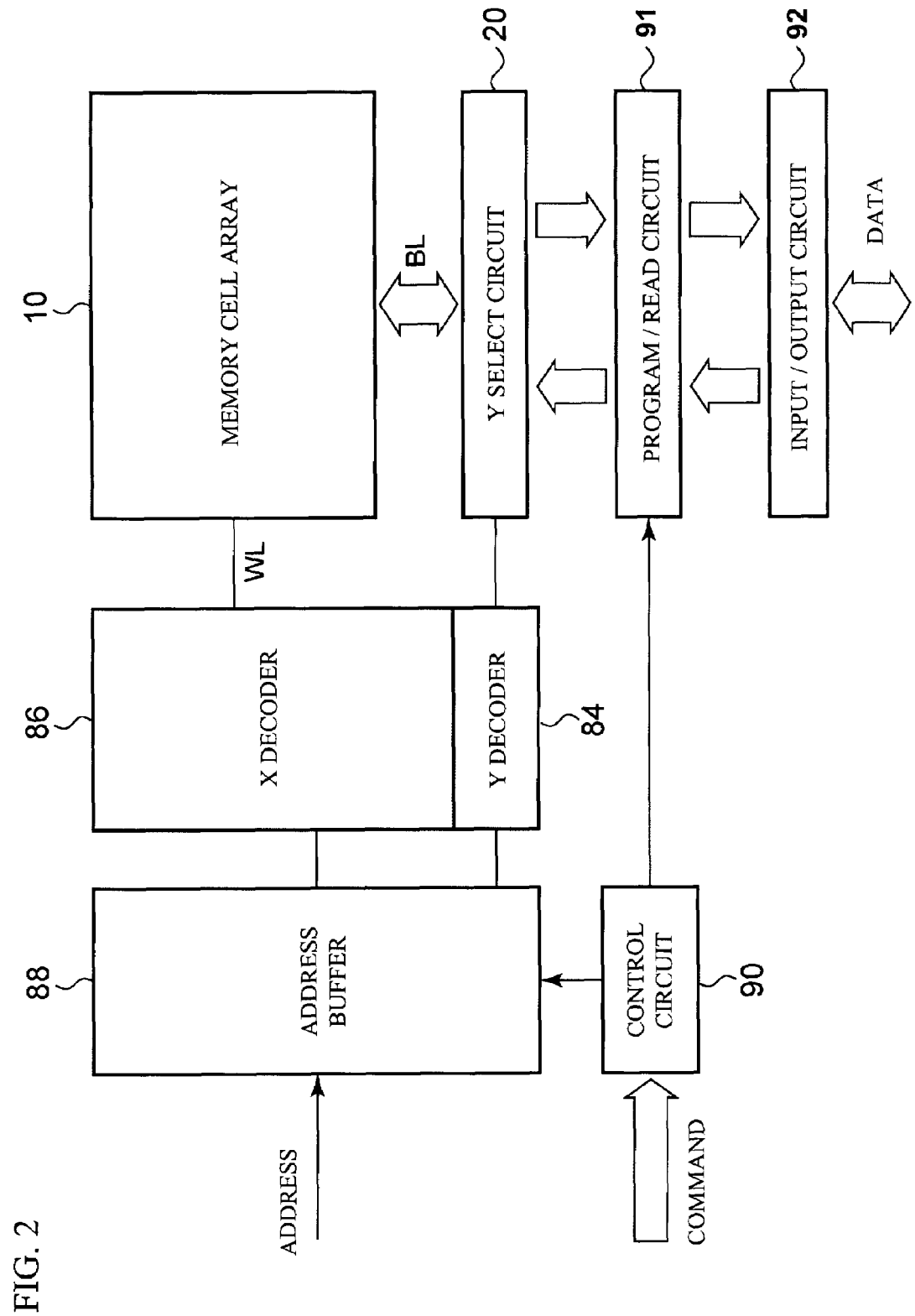
FIG. 2 is a block diagram of a flash memory employed in a first exemplary embodiment.

FIG. 2 is a block diagram of a flash memory employed in a first exemplary embodiment. A memory cell array 10 includes multiple non-volatile memory cells. The bit line BL of the memory cell array 10 is connected to a Y select circuit 20 selecting the bit line BL. The word line WL of the memory cell array 10 is connected to an X decoder 86. An address fed from the outside is input through an address buffer 88 to the X decoder 86 and to a Y decoder 84. The X decoder 86 programs data in a memory cell and selects the word line WL connected to the memory cell when programming, erasing, and reading the data. The Y decoder 84 causes the Y select circuit 20 to select the bit line BL.

The data to be programmed into the memory cell or read therefrom is input into or output from an input/output circuit 92 through a program/read circuit 91. The input/output circuit 92 inputs or outputs data to or from the outside. A command externally input is fed to a control circuit 90. The control circuit 90 controls the address buffer 88 and the program/read circuit 91 and inputs or outputs the data in the memory cell designated by the address to or from the outside.

Figure 3:
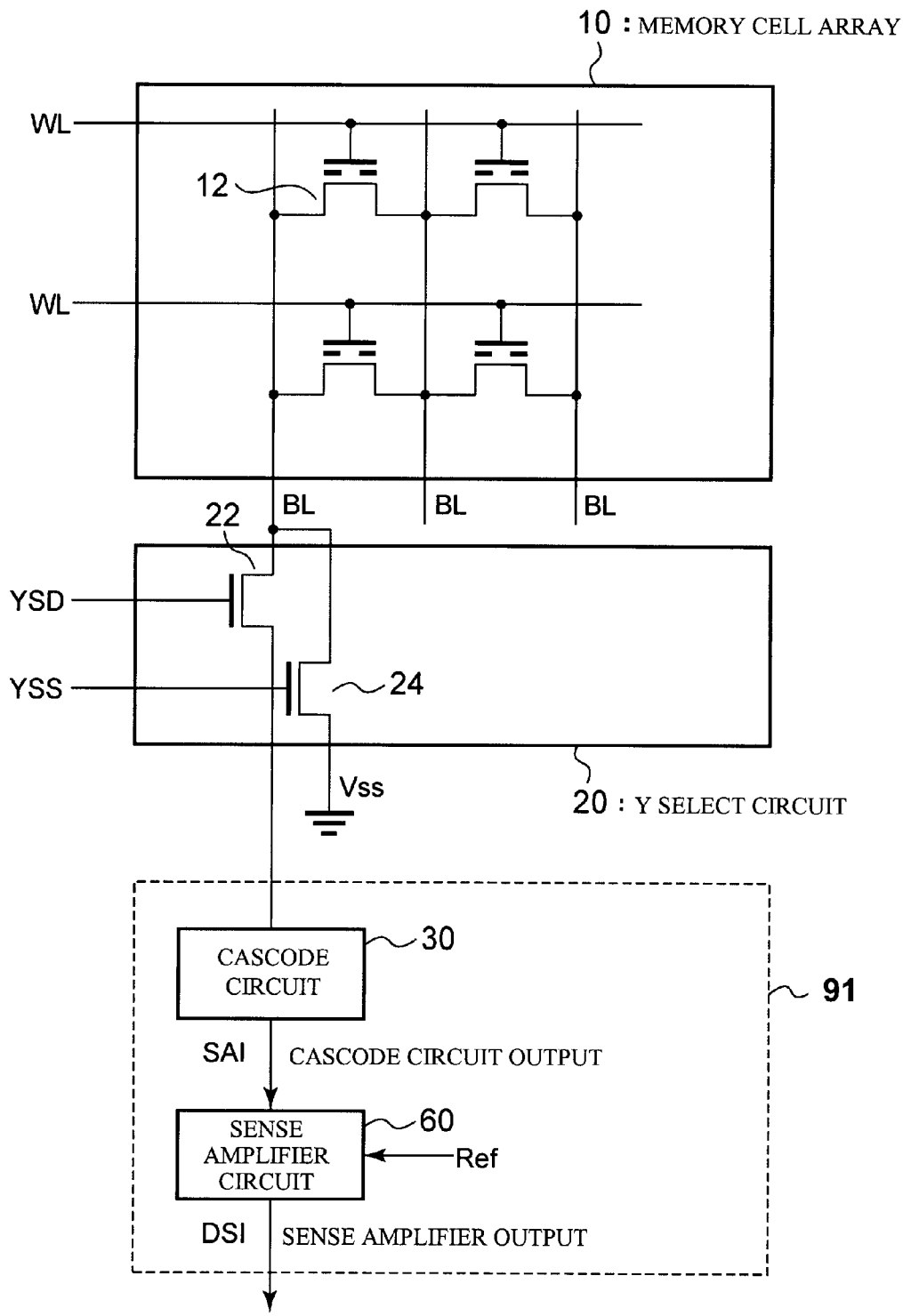
FIG. 3 is a block diagram showing a memory cell array, a cascode circuit, and a sense amplifier circuit employed in the first exemplary embodiment.

FIG. 3 is a block diagram showing the memory cell array 10, the Y select circuit 20, and a cascode circuit 30 and a sense amplifier circuit 60, which are a part of the program/read circuit 91. The memory cell array 10 includes multiple non-volatile memory cells 12 arranged in a matrix. The memory cell 12 is a virtual ground type flash memory cell. The virtual ground type memory cell employs a trap layer made of a silicon nitride film as a charge storage layer, and operates in a symmetrical manner by switching the source and drain thereof. This allows one memory cell 12 to store two bits therein.

The gate of the memory cell 12 is coupled to the word line WL, and the source and drain thereof are connected to the bit line BL. The bit line BL is connected to a drain select FET 22 of the Y select circuit 20 and to a source select FET 24 thereof. When the drain select line YSD turns on the drain select FET 22, the bit line BL is connected to the cascode circuit 30. When the source select line YSS turns on the source select FET 24, the bit line BL is grounded. When the data in the memory cell 12 is read, the bit line BL is coupled to the cascode circuit 30. The cascode circuit 30 converts the current flowing across the memory cell 12 into voltage, and outputs an output SAI to the sense amplifier circuit 60. The sense amplifier circuit 60 compares the output SAI from the cascode circuit 30 with a reference output relating to a reference cell, determines whether the data in the memory cell is "0" or "1", and outputs DSI.

Figure 4:
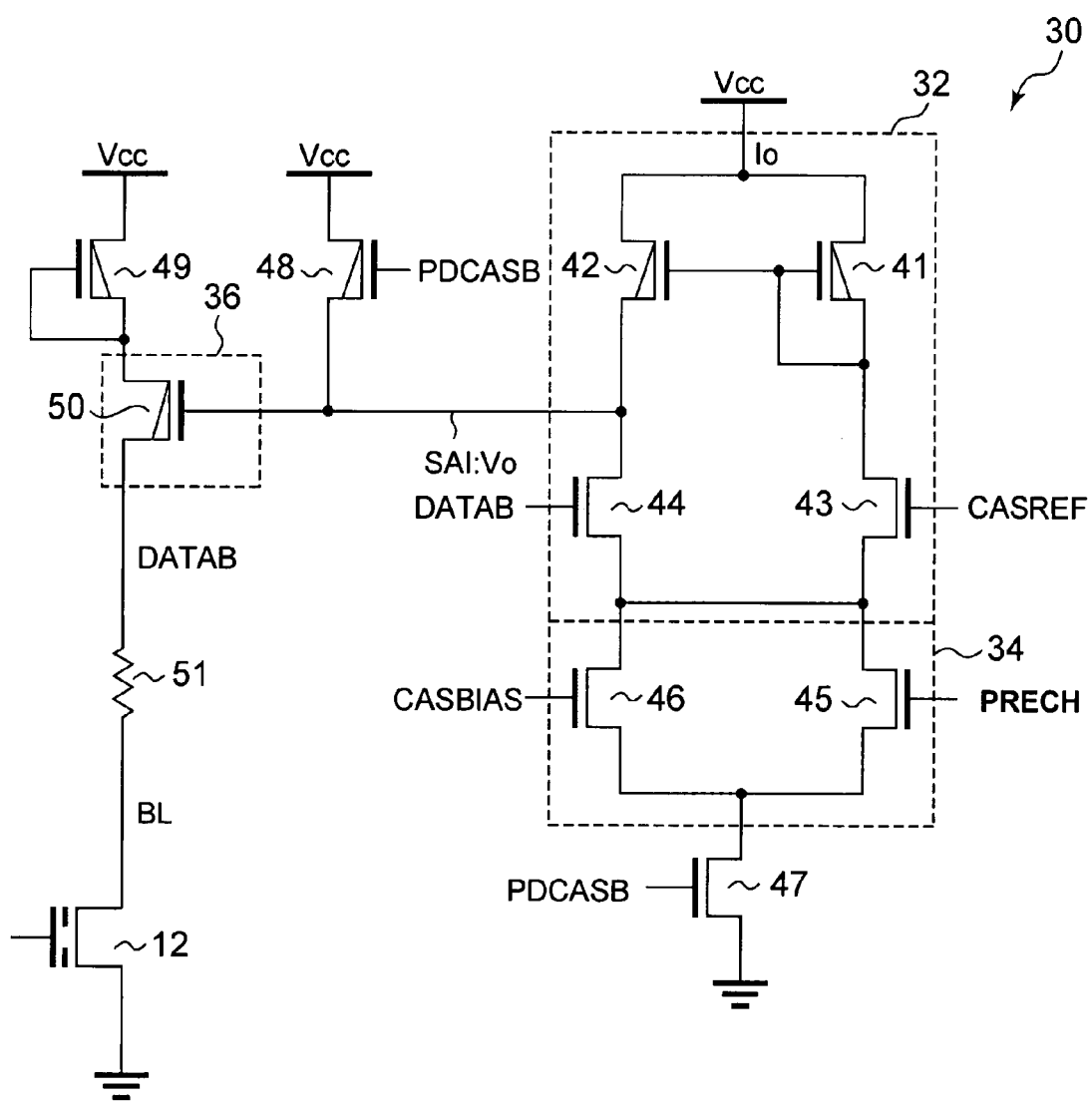
FIG. 4 is a circuit diagram of a cascode circuit employed in the first exemplary embodiment.

FIG. 4 is a circuit diagram of the cascode circuit 30. The bit line BL connected to the memory cell 12 is connected through a pass gate 51 to DATAB. A current mirror type differential amplifier circuit 32 is composed of: a P-FET 41; a P-FET 42; an N-FET 43; and an N-FET 44, and is arranged between the voltage source Vcc and a current source 34. DATAB is input into the gate of the FET 44, and a reference voltage CASREF (for example, 1.2 V) is fed to the gate of the FET 43. The current source 34 is interposed between the differential amplifier circuit 32 and ground, and provides current to the differential amplifier circuit 32. In the current source 34, an N-FET 45 and an N-FET 46 are connected in parallel, between the differential amplifier circuit 32 and ground. While the bit line BL is being precharged, a PRECH of a high level is connected to the gate of the N-FET 45. Accordingly, the N-FET 45 turns on at the time of precharging, and turns off after precharging is finished. CASBIAS is connected to the gate of the N-FET 46. The N-FET 46 is turned on while precharging is being performed or the data is being read. An N-FET 47 arranged between the current source 34 and ground functions as a switch for operating the differential amplifier circuit 32 with an actuating signal PDCASB.

A P-FET 48, which is turned on or off by the actuating signal PDCASB, is connected between the output SAI (voltage Vo) of the differential amplifier circuit 32 and the voltage source Vcc. The output SAI from the differential amplifier circuit 32 is connected to the gate of a P-FET 50. The drain of the FET 50 is connected to DATAB. The source of the FET 50 is connected through the P-FET 49 to the voltage source Vcc. During precharging, the FET 49 functions as a resistor for limiting the current flowing into the bit line BL from the voltage source Vcc. If the voltage of DATAB is higher than the reference voltage CASREF, the FET 50 flows more current. If lower, the FET 50 flows less current. As described above, the FET 50 precharges the bit line BL through DATAB, to the reference voltage CASREF. When precharging is finished and the current in the memory cell 12 is read, the current flowing across the memory cell 12 is converted into the output voltage Vo of the differential amplifier circuit 32 and output to the sense amplifier circuit 60.

As described heretofore, the cascode circuit 30 includes the FET (Field Effect Transistor) 50, which is a voltage control circuit 36 controlling the voltage supplied to the bit line BL from the voltage source Vcc, in response to the control voltage Vo. The cascode circuit 30 also includes: the differential amplifier circuit 32 coupled to the voltage control circuit 36 and supplying the control voltage Vo to the voltage control circuit 36 in response to the voltage of the node DATAB coupled to the bit line BL and the reference voltage CASREF; and the current source 34 providing a current to the differential amplifier circuit 32.

Figure 5:
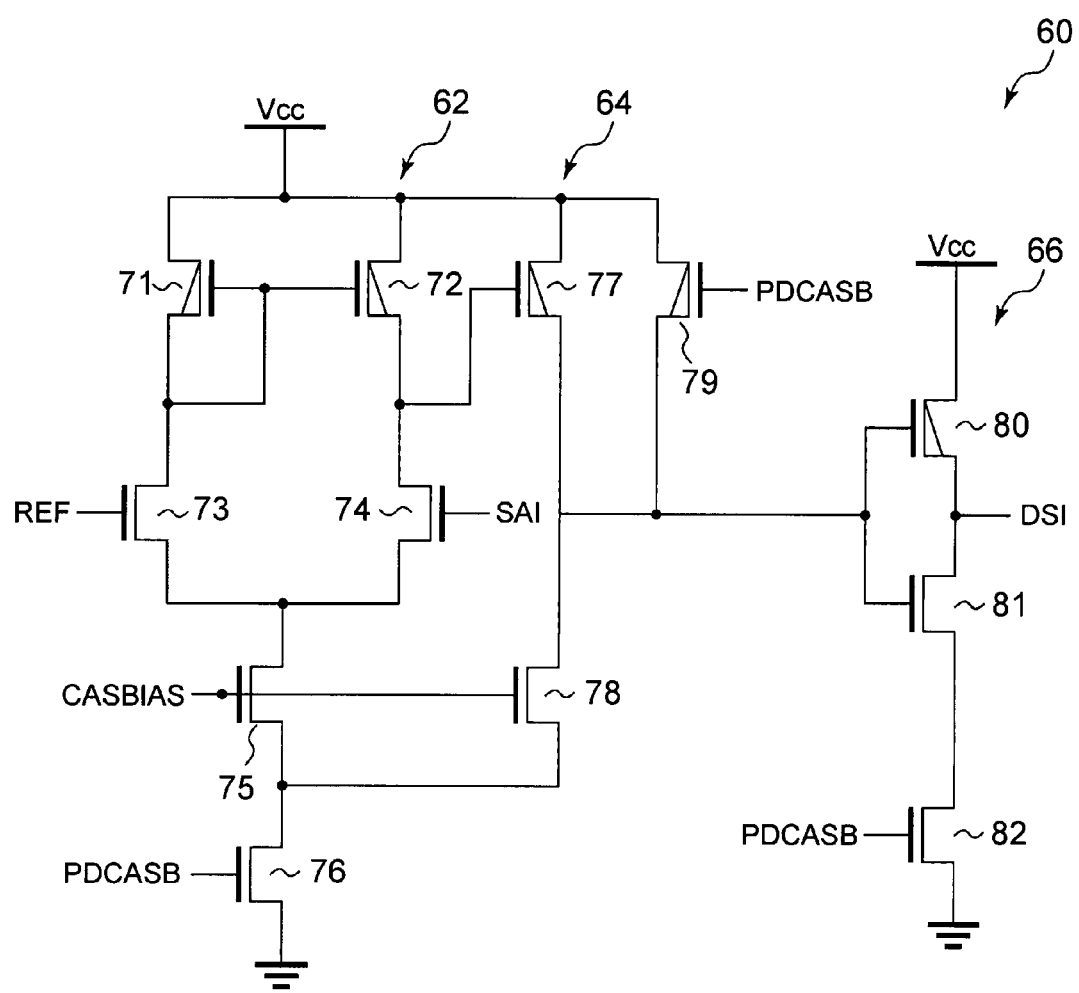
FIG. 5 is a circuit diagram of a sense amplifier circuit employed in the first exemplary embodiment.

FIG. 5 is a circuit diagram of the sense amplifier circuit 60. The sense amplifier circuit 60 includes: a current mirror type differential amplifier circuit 62 having a P-FET 71, a P-FET 72, an N-FET 73, an N-FET 74, and an N-FET 75; an amplifer circuit 64 having a P-FET 77, an N-FET 78; and an inverter 66 having a P-FET 80 and an N-FET 81. FETs 76, 79, and 82 function as switches for activating the sense amplifier circuit 60 by means of the actuating signal PDCASB.

The output SAI from the cascode circuit 30 and the reference voltage REF relating to the reference cell are respectively input into the current mirror type differential amplifier circuit 62. If SAI is lower than REF, an amplifier circuit 64 outputs a low level and the inverter 66 outputs a high level to the output DSI of the sense amplifier circuit 60. If SAI is higher than REF, the amplifier circuit 64 outputs a high level and the inverter 66 outputs a low level to DSI. In this manner, it is determined whether the memory cell 12 has "1" or "0", by comparing the output SAI from the cascode circuit 30 and the reference voltage REF.

In one embodiment, during precharging, the FET 45 is kept on and the FET 45 and the FET 46 supply a large amount of current to the differential amplifier circuit 32. After precharging, while the sense amplifier circuit 60 is reading the data of the memory cell 12 by use of the output SAI of the cascode circuit 30 and the reference voltage REF, the FET 45 is kept off and only the FET 46 provides a current to the differential amplifier circuit 32.

Figure 6A:
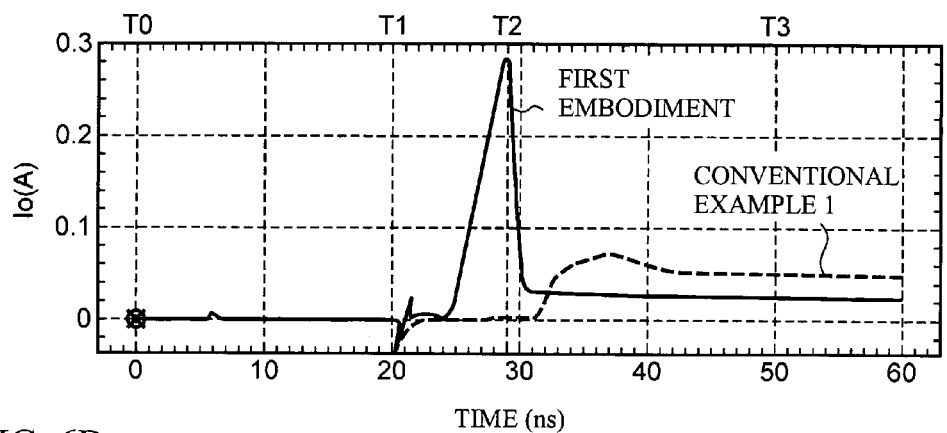
FIG. 6A through FIG. 6C are views showing calculation results, with respect to time, of the current Io flowing across a differential amplifier circuit, the output voltage Vo of the differential amplifier circuit, and the voltage VDATAB of DATAB.
Figure 6B:
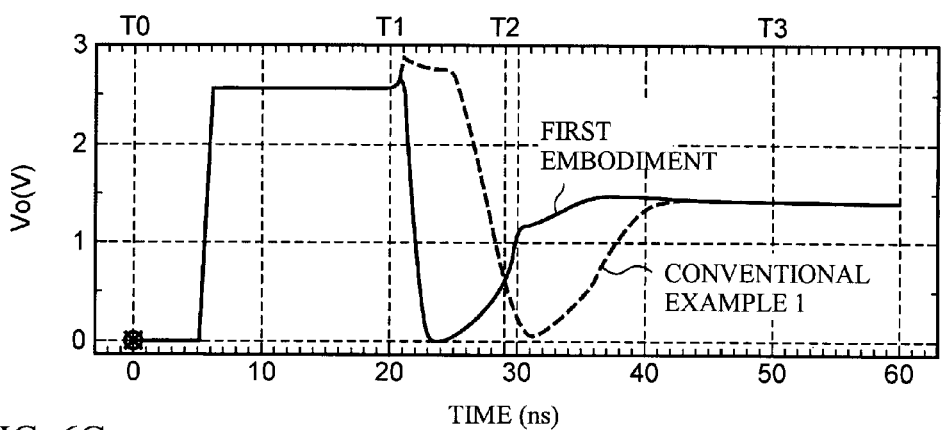
Figure 6C:
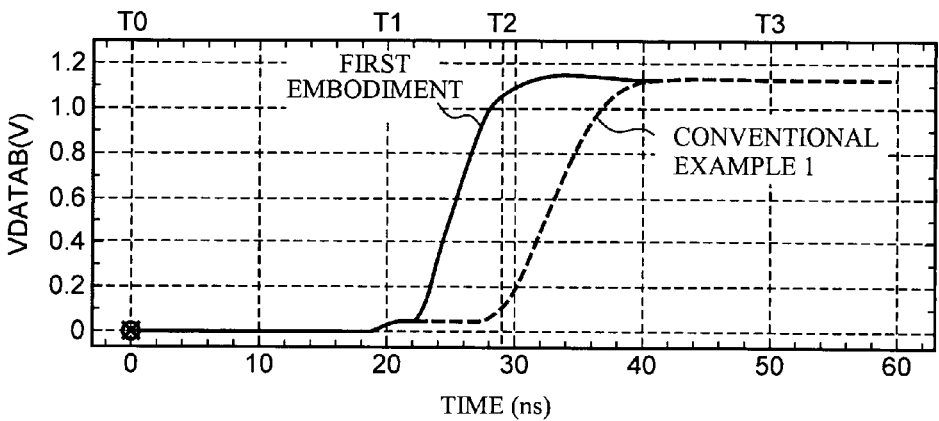

FIG. 6A through FIG. 6C are views showing calculation results, with respect to time, of the current Io flowing across the differential amplifier circuit 32, the output voltage Vo of the differential amplifier circuit 32, and the voltage VDATAB of DATAB. The solid line represents an embodiment in which the FET 45 is included and the FET 45 is switched on during precharging, and a dotted line represents a conventional example 1 in which the FET 45 is not included.

The address is changed at the time T0, and an operation starts reading data from the memory cell 12 relating to the cascode circuit 30 and the sense amplifier circuit 60. From the time T0 to the time T1, a preparation for reading the data is being done so as to generate a high voltage at a high-voltage generation circuit such as a booster circuit or the like.

At the time T1, PDCASB becomes a high level. This switches on the FET 47 shown in FIG. 4 and switches off the FET 48, and the cascode circuit 30 is activated. Also, the FETs 76 and 82 in FIG. 5 are turned on and the FET 79 is turned off. This activates the sense amplifier circuit 60. When precharging starts, the FET 45 in FIG. 4 turns on in one embodiment. This provides a current to the differential amplifier circuit 32 from the FET 46 and the FET 45 in the current source 34. Accordingly, as shown in FIG. 6A, the current Io flowing across the differential amplifier circuit 32 increases in one embodiment, in a similar manner as the conventional example 1.

As shown in FIG. 6B and FIG. 6C, the output Vo of the differential amplifier circuit 32 and VDATAB are drastically stable in one embodiment, as compared to those of the conventional example 1, and become almost stable at the time of 30 ns. That is, precharging is completed in one embodiment. After precharging is completed, the sense amplifier circuit 60 senses and reads data from the memory cell 12. In one embodiment, the FET 45 is switched off at the time T2. That is to say, the current supplied to the differential amplifier circuit 32 from the current source 34 is decreased. On the other hand, in the conventional example 1, as shown in FIG. 6B and FIG. 6C, Vo and VDATAB become stable at the time of 40 ns. As stated, in accordance with an embodiment, the precharging time can be shortened by 5 to 10 ns. At the time T3, the sense amplifier circuit 60 finishes sensing. That is, the data finishes being read from the memory cell 12. Then, PDCASB becomes a low level, and the cascode circuit 30 and the sense amplifier circuit 60 are caused to be deactivated.

Figure 7A:
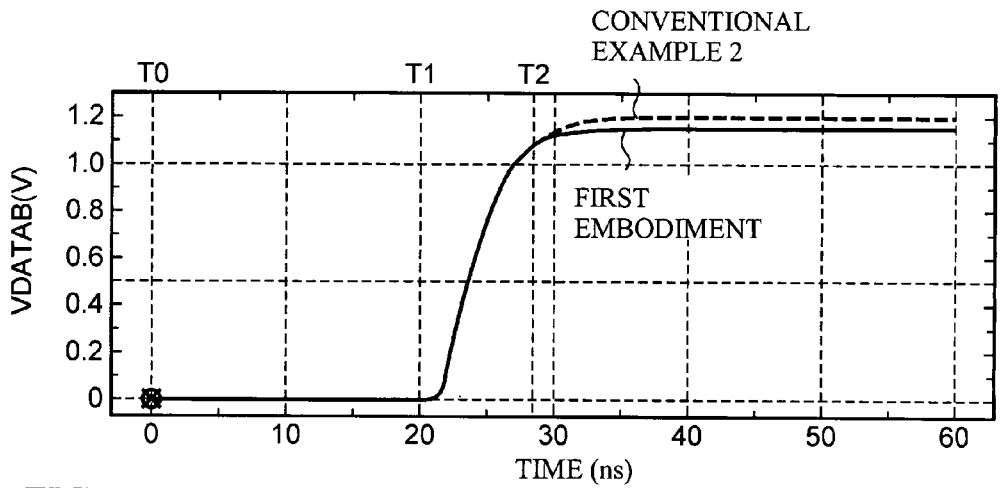
FIG. 7A through FIG. 7C are views showing calculation results, with respect to time, of the voltage VDATAB of DATAB, the current Io of the differential amplifier circuit, and the total current Itotal of the cascode circuit.
Figure 7B:
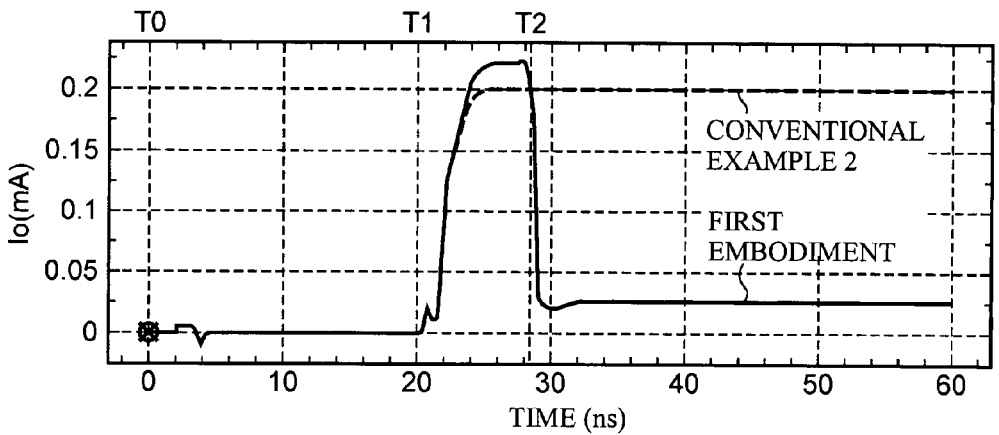
Figure 7C:
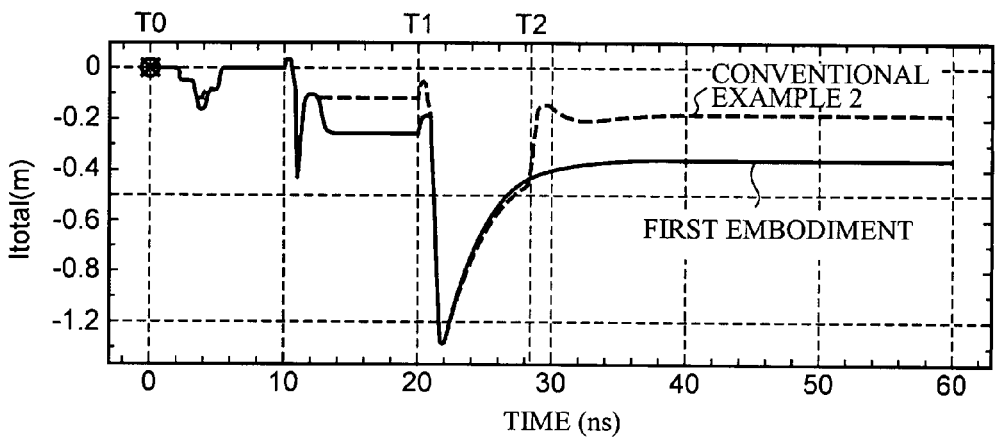

Next, a description will be given of the calculation results of a case where the FET 46 is greater and the bit line BL is so configured as to be precharged for the same period as that of one embodiment. FIG. 7A through FIG. 7C are views showing calculation results, with respect to time, of the voltage VDATAB of DATAB, the current Io of the differential amplifier circuit 32, and the total current Itotal of the cascode circuit 30. As shown in FIG. 7A, when precharging starts at the time T1, the bit line BL is precharged for an almost same period as that of one embodiment, in the conventional example 2. As shown in FIG. 7B and FIG. 7C, Io and Itotal are almost same during the period from T1 to T2, while the FET 45 employed in one embodiment keeps on. However, at T2, when the FET 45 is switched off, the current Io flowing across the differential amplifier circuit 32 employed in one embodiment decreases from T2 and later. On the other hand, in the conventional example 2, Io keeps constant in order to supply the same current as the period from T1 to T2, from the current source to the differential amplifier circuit 32. Itotal decreases because Io decreases from T2 and later in one embodiment, but does not decrease in the conventional example 2.

Table 1 shows a summary described heretofore. This is a table showing average of the current Io of the differential amplifier circuit 32 and that of the total current Itotal of the cascode circuit 30, when data is read from one memory cell 12. As shown in Table 1, it is possible to cut down the current in one embodiment, as compared to the conventional example 2.

TABLE 1

|  | Average Itotal | Average Io |
| --- | --- | --- |
| Conventional Example | 0.440 mA | 0.187 mA |
| Embodiment | 0.305 mA | 0.060 mA |

In accordance with an embodiment, a first current refers to a current that the current source 34 supplies to the differential amplifier circuit 32 during a first period (the period from T1 to T2) including the period for precharging the bit line BL. Also, a second current refers to a current that the current source 34 supplies to the differential amplifier circuit 32 during a second period (from T2 and later) including the period for reading data from the memory cell 12 (that is, the period while the differential amplifier circuit 32 is operating), the bit line BL of which has finished being precharged. At this time, as shown in FIG. 6A through FIG. 7C, the first current is greater than the second current. Since the voltage of the bit line BL is boosted from, for example, 0 V to 1.2 V during precharging period, there is a need for the current source 34 to supply a large amount of current to the differential amplifier circuit 32 as the first current in order to stabilize the voltage of the bit line BL at an early stage. Accordingly, during the first period, it is possible to shorten the period necessary for precharging by causing the current source 34 to supply a large amount of current to the differential amplifier circuit 32. Meanwhile, after precharging has been finished, the voltage of the bit line BL is only maintained at 1.2 V and there is no longer need to provide a large amount of current to the differential amplifier circuit 32. In other words, during the second period, the consumption current can be cut down by supplying the second current, which has a smaller amount, to the differential amplifier circuit 32. That is, it is possible to shorten the period for precharging the bit line and to cut down the consumption power at the time of reading data.

The voltage control circuit 36 has a function of controlling the voltage supplied to the bit line BL from the voltage source Vcc on the basis of the control voltage V0. However, as shown in FIG. 4, the voltage control circuit 36 can be configured with ease by employing the FET 50 as the voltage control circuit 36, connecting the source and drain through the current limiting element FET 49 to the voltage source Vcc and to the bit line, and supplying the control voltage V0 to the gate.

Also, as the current source 34, there are provided two FETs 45 and 46 (sub-current source). During the first period, the two FETs 45 and 46 supply current to the differential amplifier circuit 32, and during the second period, the FET 46, which is one of the two FETs 45 and 46, supplies current to the differential amplifier circuit 32. In this manner, by configuring the current source 34 with the two FETs 45 and 46, it is possible to change the current supplied to the differential amplifier circuit 32 with ease and in a prompt manner, when the first period is changed to the second period. As the current source 34, optionally, in addition to the configuration described in just described, for example, one FET 46 may be provided and CASBIAS be so changed as to vary the current to be supplied to the differential amplifier circuit 32. In addition, a transistor may be employed for the sub-current source with ease, like the FETs 45 and 46.

Embodiments described above may be examples of virtual ground type memory cells used as the memory cell 12. However, the present invention may be applicable to SONOS flash memory cells, floating gate flash memory cells, other non-volatile memory cells, and memory cells other than non-volatile memory cells.

Embodiments generally relate to semiconductor devices. More particularly, embodiments allow for a semiconductor device that provides a large amount of current to a differential amplifier during precharging and a small amount of current after precharging, so as to shorten precharge time while at the same time limiting unnecessary current consumption. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 μA).

Figure 8:
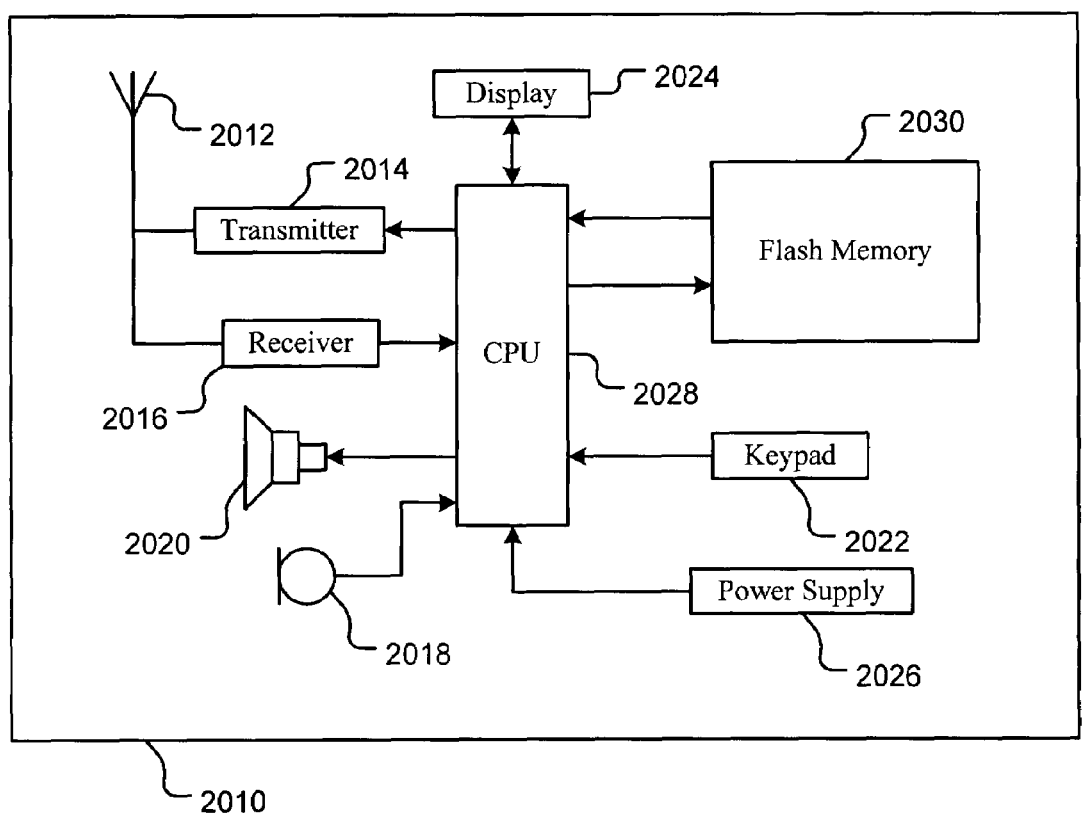

FIG. 8 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a bit line connected to a memory cell, a voltage control circuit coupled to the bit line and controlling a voltage supplied from a voltage source to the bit line in response to a control voltage, a differential amplifier circuit coupled to the voltage control circuit and providing the control voltage thereto in response to a voltage associated with the bit line and a reference voltage, and a current source providing a current to the differential amplifier circuit, wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current. According to various embodiments, it is possible to provide a semiconductor device, such as flash memory, that provides a large amount of current to a differential amplifier during precharging and a small amount of current after precharging, so as to shorten precharge time while at the same time limiting unnecessary current consumption. The present invention also provides a method of manufacturing such a semiconductor device. As a result, the flash memory 2030 operates faster and more efficiently that conventional flash memory. This increased speed and efficiency for the flash memory translates into increased speed, efficiency, and reliability for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 9:
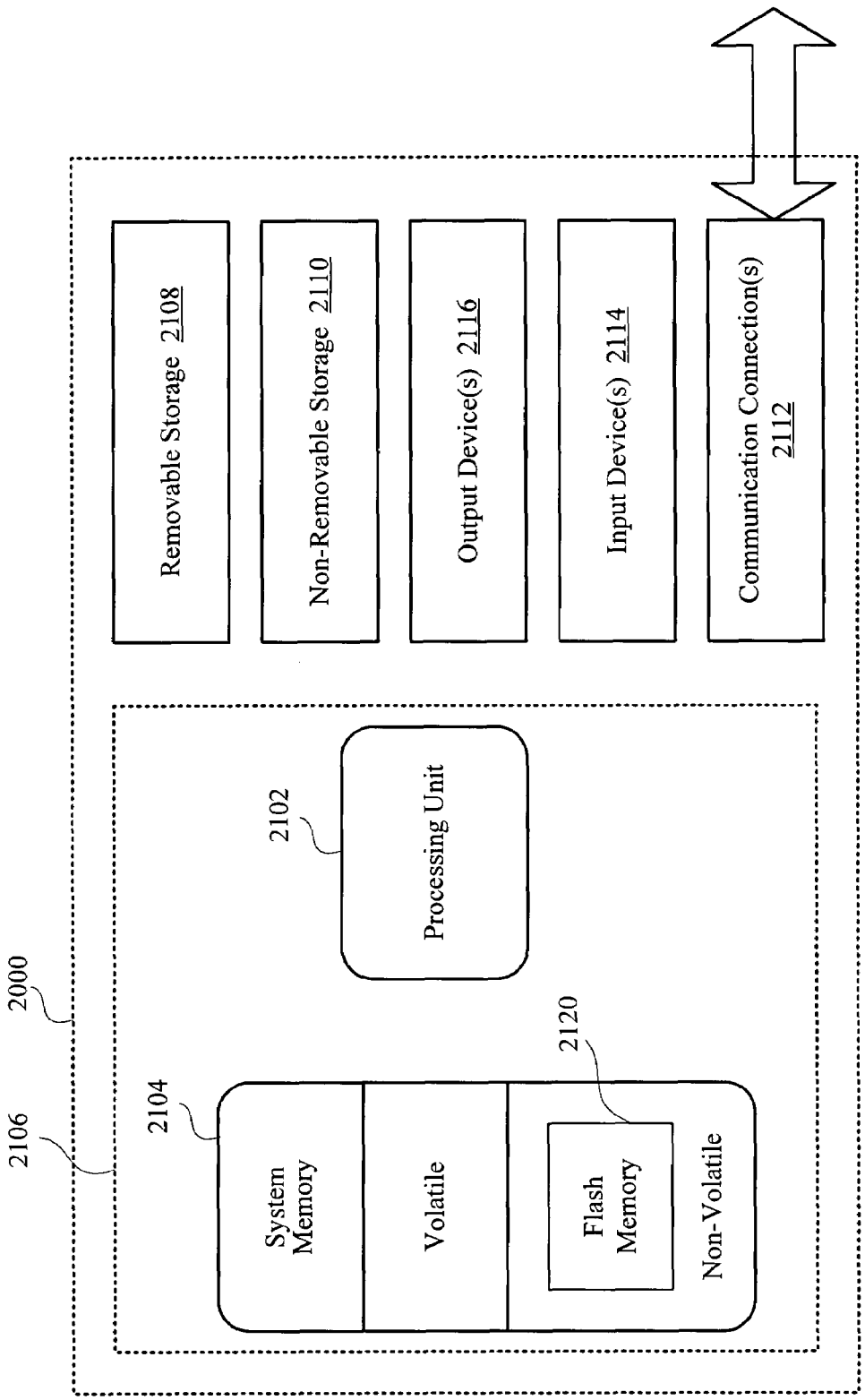

FIG. 9 illustrates a block diagram of a computing device 2100, upon which embodiments of the present invention can be implemented. Although computing device 2100 is shown and described in FIG. 9 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 9.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 11 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 9 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a bit line connected to a memory cell, a voltage control circuit coupled to the bit line and controlling a voltage supplied from a voltage source to the bit line in response to a control voltage, a differential amplifier circuit coupled to the voltage control circuit and providing the control voltage thereto in response to a voltage associated with the bit line and a reference voltage, and a current source providing a current to the differential amplifier circuit, wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current. According to various embodiments, it is possible to provide a semiconductor device, such as flash memory, that provides a large amount of current to a differential amplifier during precharging and a small amount of current after precharging, so as to shorten precharge time while at the same time limiting unnecessary current consumption. The present invention also provides a method of manufacturing such a semiconductor device. As a result, the flash memory 2030 operates faster and more efficiently that conventional flash memory. This increased speed and efficiency for the flash memory translates into increased speed, efficiency, and reliability for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 10:
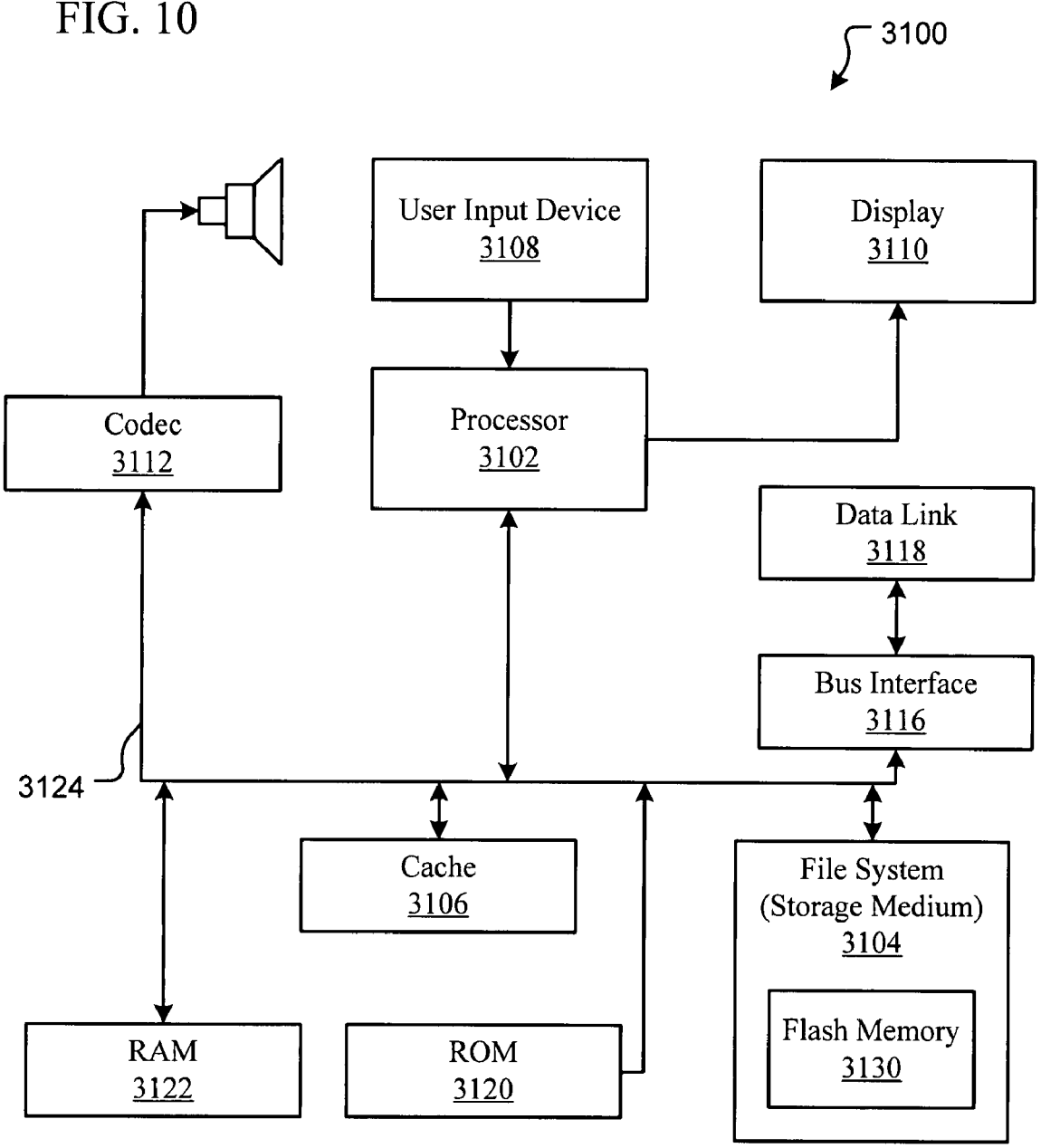

FIG. 10 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a bit line connected to a memory cell, a voltage control circuit coupled to the bit line and controlling a voltage supplied from a voltage source to the bit line in response to a control voltage, a differential amplifier circuit coupled to the voltage control circuit and providing the control voltage thereto in response to a voltage associated with the bit line and a reference voltage, and a current source providing a current to the differential amplifier circuit, wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current. According to various embodiments, it is possible to provide a semiconductor device, such as flash memory, that provides a large amount of current to a differential amplifier during precharging and a small amount of current after precharging, so as to shorten precharge time while at the same time limiting unnecessary current consumption. The present invention also provides a method of manufacturing such a semiconductor device. As a result, the flash memory 2030 operates faster and more efficiently that conventional flash memory. This increased speed and efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various embodiments of the present invention are summarized in the following.

According to one embodiment of the present invention, there is provided a semiconductor device including: a bit line connected to a memory cell; a voltage control circuit coupled to the bit line and controlling a voltage supplied from a voltage source to the bit line in response to a control voltage; a differential amplifier circuit coupled to the voltage control circuit and providing the control voltage thereto in response to a voltage associated with the bit line and a reference voltage; and a current source providing a current to the differential amplifier circuit, and the current source provides a first current to the differential amplifier circuit during a first period including a period for precharging the bit line, and provides a second current to the differential amplifier circuit during a second period including a period for reading data from the memory cell after precharging the bit line, the first current being larger than the second current.

In the above-described configuration, the voltage control circuit may be a field effect transistor (FET); and the control voltage may be provided to a gate of the FET. With this configuration, the voltage control circuit can be configured with ease.

In the above-described configuration, the current source may include a pair of sub-current sources; the pair of sub-current sources may provide the current to the differential amplifier circuit during the first period, and one of the pair of sub-current sources may provide the current to the differential amplifier circuit during the second period. With this configuration, it is possible to vary the current to be supplied to the differential amplifier circuit with ease in a prompt manner.

In the above-described configuration, the pair of sub-current sources may be a pair of transistors. In the above-described configuration, the differential amplifier circuit may be a current mirror type differential amplifier circuit.

In the above-described configuration, the memory cell may be a nonvolatile memory cell. In the above-described configuration, the memory cell may be a virtual ground type memory cell.

According to one embodiment of the present invention, there is provided a method for controlling a semiconductor device including a bit line connected to a memory cell, a voltage control circuit controlling a voltage supplied from a voltage source to the bit line in response to a control voltage, and a differential amplifier circuit providing the control voltage to the voltage control circuit in response to a voltage associated with the bit line and a reference voltage, and a memory cell array having nonvolatile memory cells, the method including: providing a first current to the differential amplifier circuit during a first period including a period for precharging the bit line; and providing a second current smaller than the first current, to the differential amplifier circuit during a second period including a period for reading data from the memory cell after precharging the bit line.

In the above-described configuration, providing the first current to the differential amplifier circuit during the first period may include providing the first current to the differential amplifier circuit from a pair of sub-current sources, and providing the second current to the differential amplifier circuit during the second period may include providing the second current to the differential amplifier circuit from one of the pair of sub-current sources. With this configuration, it is possible to vary the current to be supplied to the differential amplifier circuit with ease in a prompt manner.

In the above-described configuration, the pair of sub-current sources may be a pair of transistors.

According to an embodiment of the present invention, it is possible to provide a semiconductor device and a control method thereof, by which the time for precharging the bit line can be shortened and the consumption power can be cut down at the time of reading data.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising:
a bit line connected to a memory cell;
a voltage control circuit coupled to the bit line and controlling a voltage supplied from a voltage source to the bit line in response to a control voltage;
a differential amplifier circuit coupled to the voltage control circuit and providing the control voltage thereto in response to a voltage associated with the bit line and a reference voltage; and
a current source providing a current to the differential amplifier circuit,
wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current.

2. The semiconductor device as claimed in claim 1,
wherein the voltage control circuit is a field effect transistor (FET); and
wherein the control voltage is provided to a gate of the FET.

3. The semiconductor device as claimed in claim 1,
wherein the current source includes a pair of sub-current sources;
wherein the pair of sub-current sources provide the current to the differential amplifier circuit during the first period, and
wherein one of the pair of sub-current sources provides the current to the differential amplifier circuit during the second period.

4. The semiconductor device as claimed in claim 3, wherein the pair of sub-current sources are a pair of transistors.

5. The semiconductor device as claimed in claim 1, wherein the differential amplifier circuit is a current mirror type differential amplifier circuit.

6. The semiconductor device as claimed in claim 1, wherein the memory cell is a nonvolatile memory cell.

7. The semiconductor device as claimed in claim 6, wherein the memory cell is a virtual ground type memory cell.

8. A method for controlling a semiconductor device comprising a bit line connected to a memory cell, a voltage control circuit controlling a voltage supplied from a voltage source to the bit line in response to a control voltage, and a differential amplifier circuit providing the control voltage to the voltage control circuit in response to a voltage associated with the bit line and a reference voltage, and a memory cell array having nonvolatile memory cells, the method comprising:
providing a first current to the differential amplifier circuit during a first period including a period for precharging the bit line; and
providing a second current smaller than the first current, to the differential amplifier circuit during a second period including a period for reading data from the memory cell after precharging the bit line.

9. The method as claimed in claim 8,
wherein providing the first current to the differential amplifier circuit during the first period includes providing the first current to the differential amplifier circuit from a pair of sub-current sources, and wherein providing the second current to the differential amplifier circuit during the second period includes providing the second current to the differential amplifier circuit from one of the pair of sub-current sources.

10. The method as claimed in claim 9, wherein the pair of sub-current sources are a pair of transistors.

11. A wireless communications device, comprising:
a processor;
a communications component;
a transmitter;
a receiver;
an antenna connected to the transmitter circuit and the receiver circuit; and
a memory comprising:
  a bit line connected to a memory cell;
  a voltage control circuit coupled to the bit line and controlling a voltage supplied from a voltage source to the bit line in response to a control voltage;
  a differential amplifier circuit coupled to the voltage control circuit and providing the control voltage thereto in response to a voltage associated with the bit line and a reference voltage; and
  a current source providing a current to the differential amplifier circuit,
  wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current.

12. The wireless communications device of claim 11, wherein said flash memory is NAND flash memory.

13. The wireless communications device of claim 11, wherein said flash memory is NOR flash memory.

14. The wireless communications device of claim 11, wherein said flash memory comprises at least one memory cell operable to store more than one bit.

15. A computing device comprising:
a processor;
an input component;
an output component;
a memory comprising:
  a bit line connected to a memory cell;
  a voltage control circuit coupled to the bit line and controlling a voltage supplied from a voltage source to the bit line in response to a control voltage;
  a differential amplifier circuit coupled to the voltage control circuit and providing the control voltage thereto in response to a voltage associated with the bit line and a reference voltage; and
  a current source providing a current to the differential amplifier circuit,
  wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current.

16. The computing device of claim 15, wherein said computing device is a personal computer (PC).

17. The computing device of claim 15, wherein said computing device is a personal digital assistant (PDA).

18. The computing device of claim 15, wherein said computing device is a gaming system.

19. A portable media player comprising:
a processor;
a cache;
a user input component;
a coder-decoder component; and
a memory comprising:
  a bit line connected to a memory cell;
  a voltage control circuit coupled to the bit line and controlling a voltage supplied from a voltage source to the bit line in response to a control voltage;
  a differential amplifier circuit coupled to the voltage control circuit and providing the control voltage thereto in response to a voltage associated with the bit line and a reference voltage; and
  a current source providing a current to the differential amplifier circuit,
  wherein the current source provides a first current to the differential amplifier circuit during a first period including a period for precharging the bit line, and provides a second current to the differential amplifier circuit during a second period including a period for reading data from the memory cell after precharging the bit line, the first current being larger than the second current.

20. The portable media player of claim 19, wherein said portable media player is a portable music player.

21. The portable media player of claim 19, wherein said portable media player is a portable video player.

* * * * *